(12) United States Patent
Watanabe et al.

(10) Patent No.: US 6,977,837 B2
(45) Date of Patent: Dec. 20, 2005

(54) SEMICONDUCTOR MEMORY INCLUDING STATIC RANDOM ACCESS MEMORY FORMED OF FINFET

(75) Inventors: Takeshi Watanabe, Yokohama (JP); Kazunari Ishimaru, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/802,799

(22) Filed: Mar. 18, 2004

(65) Prior Publication Data

US 2005/0094434 A1 May 5, 2005

(30) Foreign Application Priority Data

Nov. 5, 2003 (JP) .............................. 2003-375851

(51) Int. Cl.$^7$ ............................................ G11C 11/00
(52) U.S. Cl. .................. 365/156; 365/230.05; 365/177
(58) Field of Search ................................ 365/156, 177, 365/154, 190, 202, 230.05, 185.23, 185.24

(56) References Cited

U.S. PATENT DOCUMENTS

| | | | |
|---|---|---|---|
| 4,709,352 A * | 11/1987 | Kitazawa | .................... 365/104 |
| 5,287,301 A * | 2/1994 | Redgrave | .................... 365/154 |
| 5,726,936 A * | 3/1998 | Whitfield | ............... 365/185.23 |
| 6,181,608 B1 * | 1/2001 | Keshavarzi et al. | ........ 365/188 |
| 2004/0223375 A1 * | 11/2004 | Annavajjhala | ......... 365/185.33 |

FOREIGN PATENT DOCUMENTS

JP   2-263473   10/1990

OTHER PUBLICATIONS

E. J. Nowak, et al., "A Functional FinFET-DGCMOS SRAM Cell", IEDM Technical Digest, International Electron Devices meeting 2002, pp. 411-414, 2002.

* cited by examiner

Primary Examiner—Richard Elms
Assistant Examiner—Dang T. Nguyen
(74) Attorney, Agent, or Firm—Oblon, Spivak, McClelland, Maier & Neustadt, P.C.

(57) ABSTRACT

A semiconductor memory is formed of first, second, third, fourth, fifth and sixth field effect transistors. The first and second transistors have a first line as gates, one ends of current paths of the first and second transistors are connected to a reference potential electrode. The third and fourth transistors have a second line as gates, and one ends of current paths of the third and fourth transistors are connected to the reference electrode. The fifth transistor has a first word line as a gate, and one end of a current path of the fifth transistor is connected to the other ends of the current paths of the first and second transistors. The sixth transistor having a second word line as a gate, and one end of a current path of the sixth transistor is connected to the other ends of the current paths of the third and fourth transistors.

16 Claims, 5 Drawing Sheets

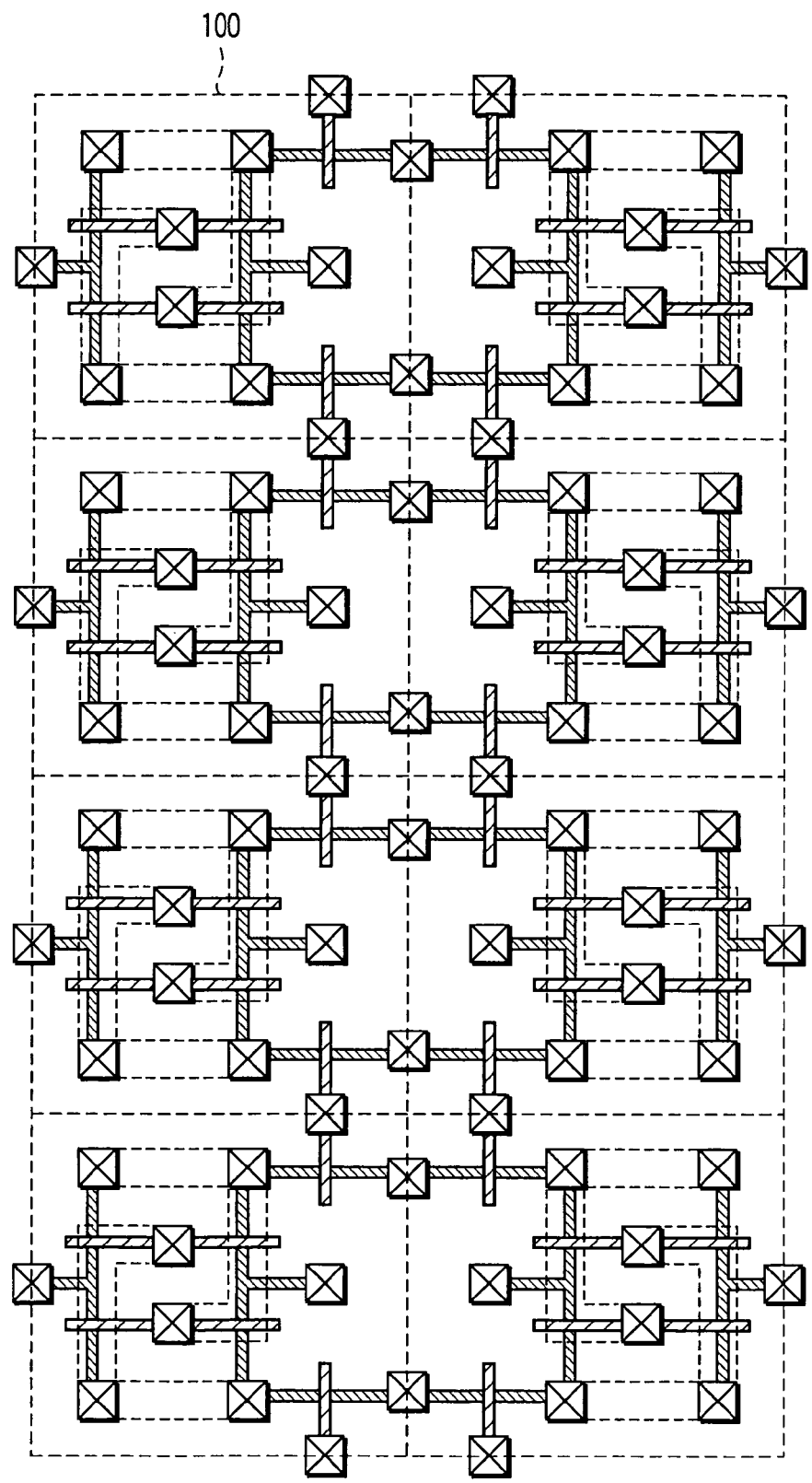
F I G. 2

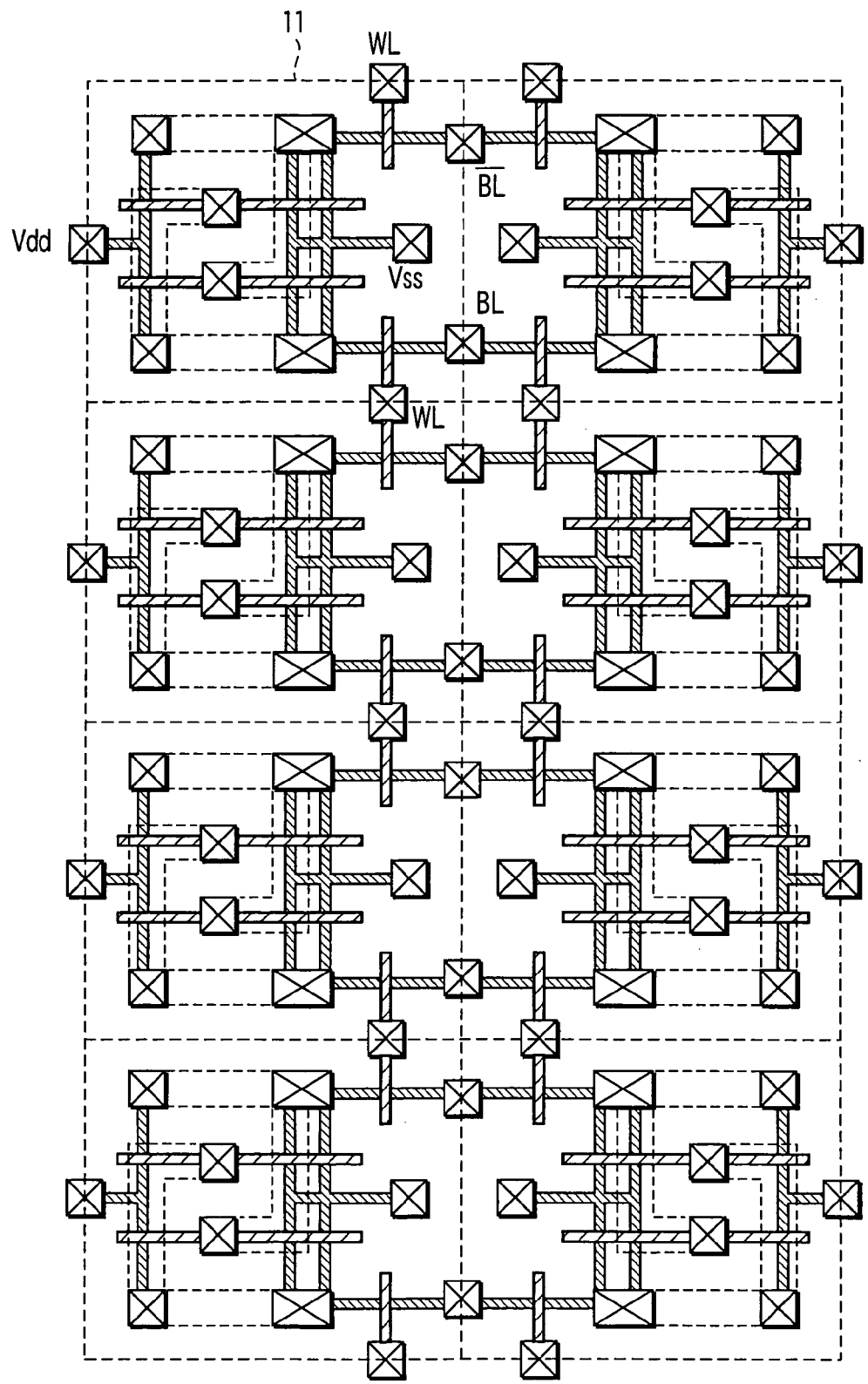
F I G. 5

SEMICONDUCTOR MEMORY INCLUDING STATIC RANDOM ACCESS MEMORY FORMED OF FINFET

CROSS-REFERENCE TO RELATED APPLICATIONS

This application is based upon and claims the benefit of priority from prior Japanese Patent Application No. 2003-375851, filed Nov. 5, 2003, the entire contents of which are incorporated herein by reference.

BACKGROUND OF THE INVENTION

1. Field of the Invention

This invention relates to a semiconductor memory, in particular, a static random access memory (hereinafter referred to as "SRAM") formed of FinFETs.

2. Description of the Related Art

Generally, when a memory cell for an SRAM (hereinafter referred to as "SRAM cell") is designed, a good data-holding property is secured by setting the device resistance of a transfer gate transistor to a value higher than that of the device resistance of a drive transistor. Specifically, this is achieved by providing a driver transistor having a shorter channel length (L) and a wider channel width (W) than those of the transfer gate transistor.

Recently, as a transistor of a new structure, Fin typed Double-Gate MIS field effect transistor (hereinafter referred to as "FinFET") having a three-dimensional structure receive attention. The FinFET has the following structure.

A single-crystal silicon layer of an SOI (silicon on insulator) substrate is processed into rectangular pieces to form projecting regions (hereinafter referred to as "fin layer") being semiconductor regions. A gate electrode is crossed over the fin layer, and thereby the fin layer is used as a channel (for example, please refer to Jpn. Pat. Appln. KOKAI Pub. No. 2-263473).

SRAMs formed of the FinFETs have been proposed (for example, please refer to E. J. Nowak et al., "A Functional FinFET-DGCMOS SRAM Cell", IEDM 2002. Technical Digest, pp 411–414). FIG. 1 is a layout diagram illustrating an SRAM cell formed of FinFETs. FIG. 2 is a layout diagram illustrating a cell array of an SRAM, in which the SRAM cells are arranged. As shown in FIG. 1, an SRAM cell 100 is a 6-transistor SRAM cell, which is formed of six transistors. Specifically, the SRAM cell 100 comprises two drive transistors 101 and 102, two transfer gate transistors 103 and 104, and two load transistors 105 and 106.

However, since the channel width (W) of a FinFET depends on the height of the fin layers, it is difficult from the viewpoint of the process to allow the transistors to have different channel widths (W). Therefore, there is a problem that it is difficult to obtain a good data-holding property with an SRAM formed of FinFETs.

BRIEF SUMMARY OF THE INVENTION

According to an aspect of the present invention, a semiconductor memory of the present invention comprises: a first and a second field effect transistors having a first line as gates, one ends of current paths of the first and second field effect transistors being connected to a reference electrode supplied with a reference potential; a third and a fourth field effect transistors having a second line as gates, one ends of current paths of the third and fourth field effect transistors being connected to the reference electrode; a fifth field effect transistor having a first word line as a gate, one end of a current path of the fifth field effect transistor being connected to the other ends of the current paths of the first and second field effect transistors; and a sixth field effect transistor having a second word line as a gate, one end of a current path of the sixth field effect transistor being connected to the other ends of the current paths of the third and fourth field effect transistors.

BRIEF DESCRIPTION OF THE SEVERAL VIEWS OF THE DRAWING

FIG. 2 is a layout diagram illustrating a cell array obtained by integrating the conventional SRAM cells each formed of FinFETs.

FIG. 5 is a layout diagram of a cell array obtained by integrating the SRAM cells of the first embodiment.

DETAILED DESCRIPTION OF THE INVENTION

Figure 1:
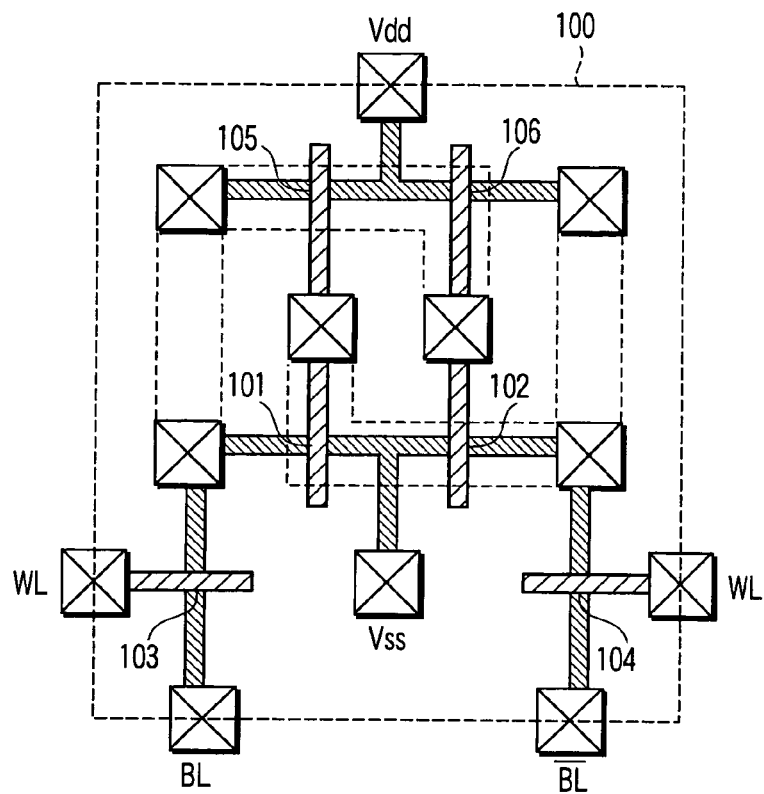
FIG. 1 is a layout diagram illustrating a structure of a conventional SRAM cell formed of FinFETs.

Embodiments of the present invention will now be explained below with reference to drawings. In explanation, like reference numerals denote like constituent elements through the drawings.

First Embodiment

Figure 3:
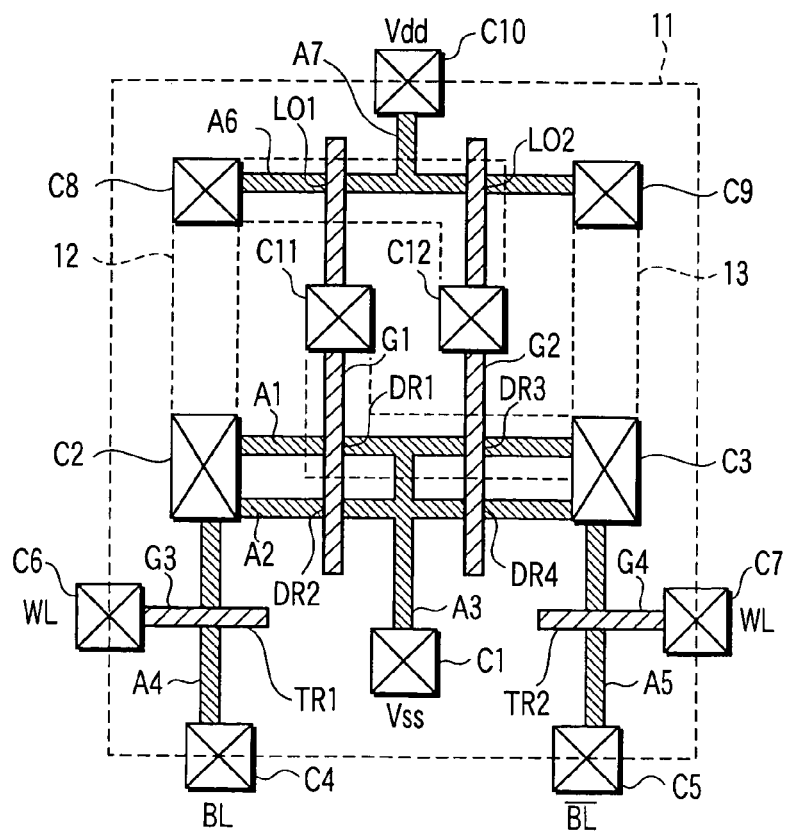
FIG. 3 is a layout diagram illustrating a structure of an SRAM cell according to a first embodiment of the present invention.
Figure 4:
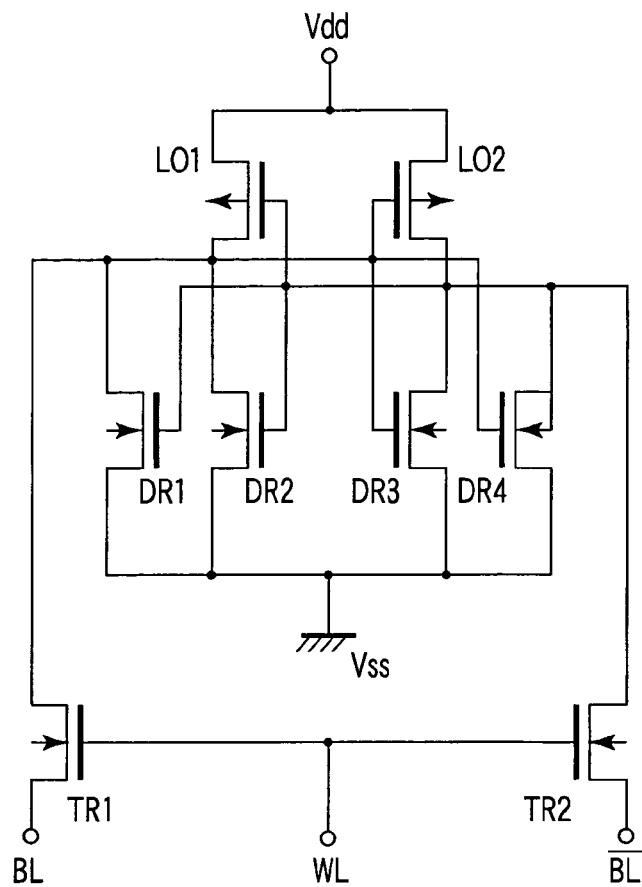
FIG. 4 is a circuit diagram of the SRAM cell of the first embodiment.

First, a semiconductor memory including an SRAM according to a first embodiment of the present invention is explained. FIG. 3 is a layout diagram illustrating a structure of an SRAM cell according to the first embodiment. FIG. 4 is a circuit diagram of the SRAM cell.

As shown in FIG. 3, in an SRAM cell 11, arranged are four drive transistors DR1, DR2, DR3 and DR4, two transfer gate transistors TR1 and TR2, and two load transistors LO1 and LO2. The SRAM cell 11 is a memory cell in an SRAM, and is a basic structure, which stores data of 1 bit.

First, the following is a detailed structure of the drive transistors DR1 to DR4. As shown in FIG. 3, active regions (element regions) A1 and A2 are formed in parallel and apart from each other. The active regions A1 and A2 are formed of projecting silicon layers (fin layers), and all the other active regions described later are formed of fin layers. Above the active regions A1 and A2, gate electrodes G1 and G2 are formed apart from each other and in parallel, such that each of the gate electrodes is orthogonal to the active regions A1 and A2. A channel region is formed in each portion of the active regions A1 and A2, which is located under the gate electrodes G1 and G2. A source and a drain are formed in portions of the active regions A1 and A2 to hold each channel region therebetween.

By such a structure, the drive transistor DR1 is formed at an intersection point of the active region A1 and the gate electrode G1, and the drive transistor DR3 is formed at an intersection point of the active region A1 and the gate electrode G2. In the same manner, the drive transistor DR2 is formed at an intersection point of the active region A2 and the gate electrode G1, and the drive transistor DR4 is formed at an intersection point of the active region A2 and the gate electrode G2.

An active region A3 which is electrically connected to the active regions A1 and A2 is formed to be orthogonal to the active regions A1 and A2. A contact C1 is formed on one end of the active region A3, and a reference potential Vss is supplied to the contact C1. Further, a contact C2 is formed on one ends of the active regions A1 and A2, and a contact C3 is formed on the other ends of the active regions A1 and A2.

Next, a detailed structure of the transfer gate transistors TR1 and TR2 are described below. As shown in FIG. 3, active regions A4 and A5 are formed such that each of them is perpendicular to the active regions A1 and A2. Above the active region A4, a gate electrode G3 is formed to be perpendicular to the active region A4. Above the active region A5, a gate electrode G4 is formed to be perpendicular to the active region A5. A channel region is formed in each portion of the active regions under the gate electrodes G3 and G4. In each of the active regions, a source and a drain are formed to hold each channel region therebetween.

By such a structure, the transfer gate transistor TR1 is formed at an intersection point of the active region A4 and the gate electrode G3, and the transfer gate transistor TR2 is formed at an intersection point of the active region A5 and the gate electrode G4.

One end of the active region A4 is connected to the contact C2, and a contact C4 is formed on the other end of the active region A4. The contact C4 is connected with a bit line BL. One end of the active region A5 is connected to the contact C3, and a contact C5 is formed on the other end of the active region A5. The contact C5 is connected with the bit line BL. Further, a contact C6 is formed on one end of the gate electrode G3, and a contact C7 is formed on one end of the gate electrode G4. The contacts C6 and C7 are connected to respective word lines WL.

Next, the detailed structure of the load transistors LO1 and LO2 is described below. As shown in FIG. 3, an active region A6 is formed in parallel with the active regions A1 and A2. The gate electrodes G1 and G2 are extended and disposed above the active region A6 such that the gate electrodes G1 and G2 are perpendicular to the active region A6. A channel region is formed in each portion of the active region A6 under the gate electrodes G1 and G2. A source and a drain are formed in portions of the active region 6 to hold each channel region therebetween.

By such a structure, the load transistor LO1 is formed at an intersection point between the active region A6 and the gate electrode G1, and the load transistor LO2 is formed at an intersection point between the active region A6 and the gate electrode G2.

A contact C8 is formed on one end of the active region A6, and a contact C9 is formed on the other end of the active region A6. An active region A7 which is electrically connected to the active region A6 is formed to be perpendicular to the active region A6. A contact C10 is formed on one end of the active region A7, and a power supply voltage Vdd is supplied to the contact C10. Further, contacts C11 and C12 are formed in the center or around of the gate electrodes G1 and G2, respectively.

A line 12 shown by a broken line in FIG. 3 connects the contacts C2, C8 and C12. A line 13 connects the contacts C3, C9 and C11.

The following is a detailed explanation of the connection relationship in the SRAM cell.

The drive transistors DR1 and DR2 have a first gate line in common as their gates, and one ends of their current paths are connected to a reference electrode supplied with the reference potential Vss. The drive transistors DR3 and DR4 have a second gate line in common as their gates, and one ends of their current paths are connected to the reference electrode supplied with the reference potential Vss.

The transfer gate transistor TR1 has a first word line as gate, and one end of a current path thereof is connected to the other ends of the current paths of drive transistors DR1 and DR2. The transfer gate transistor TR2 has a second word line as a gate, and one end of a current path thereof is connected to the other ends of the current paths of the drive transistors DR3 and DR4.

More specifically, the current paths of the drive transistors DR1 and DR2 are connected in parallel between the one end of the current path of the transfer gate transistor TR1 and the reference electrode. The current paths of the drive transistors DR3 and DR4 are connected between the one end of the current path of the transfer gate transistor TR2 and the reference electrode.

The load transistor LO1 has the first gate line as a gate, and one end of its current path is connected to a power supply electrode supplied with the power supply voltage. The load transistor LO2 has the second gate line as a gate, and one end of its current path is connected to the power supply electrode supplied with the power supply voltage.

The other ends of the current paths of the drive transistors DR1 and DR2 are connected to the other end of the current path of the load transistor LO1. The other ends of the current paths of the drive transistors DR3 and DR4 are connected to the other end of the current path of the load transistor LO2.

Further, the gates of the drive transistors DR1 and DR2 and the load transistor LO1 are connected to the other ends of the current paths of the drive transistors DR3 and DR4. The gates of the drive transistors DR3 and DR4 and the load transistor LO2 are connected to the other end of the current path of the load transistor LO1.

The SRAM cell according to the first embodiment has a structure in which two drive transistors in parallel are used instead of each of the drive transistors in the 6-transistor SRAM cell shown in FIG. 1. In a FinFET, since a fin layer (element region) formed of a projecting silicon layer is formed with a fixed height, the channel width thereof is fixed. In the embodiment, two FinFETs are connected in parallel, and thereby the effective channel width thereof is twice that of the conventional drive transistor formed of one FinFET with a fixed channel width. This reduces the total element resistance of the two drive transistors in the embodiment to $\frac{1}{2}$ that of the transfer gate transistor having one transistor. As a result, the $\beta$ ratio is 2, and it is possible to obtain a good data-holding property. In the embodiment, the ratio of the number of the drive transistors to the number of the transfer gate transistors is 2, that is, two drive transistors are arranged for each transfer gate transistor. However, the ratio is not limited to 2, but may be another number larger than 2. For example, the ratio may be 3 or 4.

FIG. 5 is a layout diagram illustrating a structure of a cell array obtained by integrating the SRAM cells. The cell array of the SRAM is formed by arranging a plurality of the SRAM cells, one of which is shown in FIG. 3, in rows and columns as shown in FIG. 5.

Second Embodiment

Next, a semiconductor memory including an SRAM according to a second embodiment of the present invention will be described. The same constituent elements as those in the structure of the first embodiment are denoted by the same respective reference numerals, and their explanations are omitted. Only different constituent elements are explained below.

Figure 6:
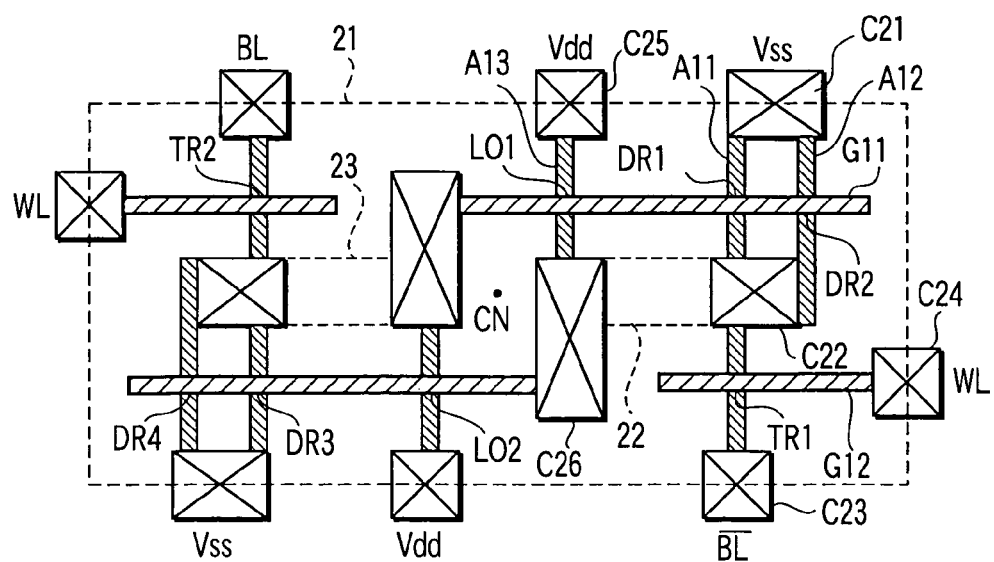
FIG. 6 is a layout diagram illustrating a structure of an SRAM cell according to a second embodiment of the present invention.

FIG. 6 is a layout diagram illustrating the structure of an SRAM cell according to the second embodiment. An SRAM cell 21 has a structure in which eight transistors are arranged symmetrically with respect to the central point CN of the SRAM cell 21. The circuit diagram of the SRAM cell 21 is the same as that of the first embodiment shown in FIG. 4.

In the SRAM cell 21, provided are four transistors, that is, drive transistors DR1 and DR2, a transfer gate transistor TR1, and a load transistor LO1. Further, the SRAM cell 21 has drive transistors DR3 and DR4, a transfer gate transistor TR2, and a load transistor LO2. The drive transistors DR1 and DR3 are arranged symmetrically with respect to the central point CN of the SRAM cell 21. The drive transistors DR2 and DR4, the transfer gate transistors TR1 and TR2, and the load transistors LO1 and LO2 are also arranged symmetrically in a like manner.

First, the following is the detailed structure of the drive transistors DR1 and DR2. As shown in FIG. 6, active regions A11 and A12 are formed in parallel, apart from each other. Each of the active regions A11 and A12 is formed of a fin layer, and all the other active regions described below are formed of fin layers. Above the active regions A11 and A12, a gate electrode G11 is formed to be crossed over the active regions A11 and A12. A channel region is formed in each portion of the active regions A11 and A12 located under the gate electrode G11. A source and a drain are formed in portions of the active regions A11 and A12 to hold each channel region therebetween.

By such a structure, the drive transistor DR1 is formed at an intersection point between the active region A11 and the gate electrode G11, and the drive transistor DR2 is formed at an intersection point between the active region A12 and the gate electrode G11.

A contact C21 formed on one ends of the active regions A11 and A12. A contact 22 is formed to be located in the central portion of the active region A11 and on the other end of the active region A12. Further, the contact C21 is supplied with a reference voltage Vss.

Next, the following is a detailed structure of the transfer gate transistor TR1. As shown in FIG. 6, the active region A11 is extended. Above the extended active region A11, a gate electrode G12 is formed orthogonal to the active region A11. A channel region is formed in a portion of the active region A11 located under the gate electrode G12, and a source and a drain which hold the channel region therebetween are formed in portions of the active region A11.

By such a structure, the transfer gate transistor TR1 is formed at an intersection point between the active region A11 and the gate electrode G12.

A contact C23 is formed on the other end of the active region A11. A bit line/BL is connected with the contact C23. Further, a contact C24 is formed on one end of the gate electrode G12. The contact C24 is connected with a word line WL.

Next, the following is a detailed structure of the load transistor LO1. As shown in FIG. 6, an active region A13 is formed in parallel with the active regions A11 and A12. Above the active region A13, the gate electrode G11 is extended and arranged orthogonal to the active region A13. A channel region is formed in a portion of the active region A13 under the gate electrode G11. A source and a drain which hold the channel region therebetween are formed in the active region A13.

By such a structure, the load transistor LO1 is formed at an intersection point between the active region A13 and the gate electrode G11.

A contact 25 is formed on one end of the active region A13, and supplied with a power supply voltage Vdd. Further, a contact C26 is formed on the other end of the active region A13.

Further, in the SRAM cell 21, the drive transistors DR3 and DR4, the transfer gate transistor TR2, and the load transistor LO2 are arranged symmetrical to the drive transistors DR1 and DR2, transfer gate transistor TR1, and the load transistor LO1, respectively, with respect to the central point CN of the SRAM cell 21. A line 22 shown by a broken line in FIG. 6 connects the contacts C22 and C26.

In the SRAM cell of the second embodiment configured as described above, two FinFETs connected in series are used instead of one conventional drive transistor, in the same manner as in the first embodiment. This increases the effective channel width of the embodiment twice that of the conventional drive transistor, and thereby the total element resistance of the two drive transistors can be reduced to ½ that of the transfer gate transistor formed of one transistor. As a result, the β ratio is 2, and a good data-holding property can be obtained. Also in this embodiment, the ratio of the number of the drive transistors to the number of the transfer gate transistors is not limited to 2, but may be other numbers exceeding 2. For example, the ratio may be 3 or 4. Further, the SRAM cell of the second embodiment is suitable for high integration, since it can be formed with an area smaller than that of the SRAM cell of the first embodiment.

Figure 7:
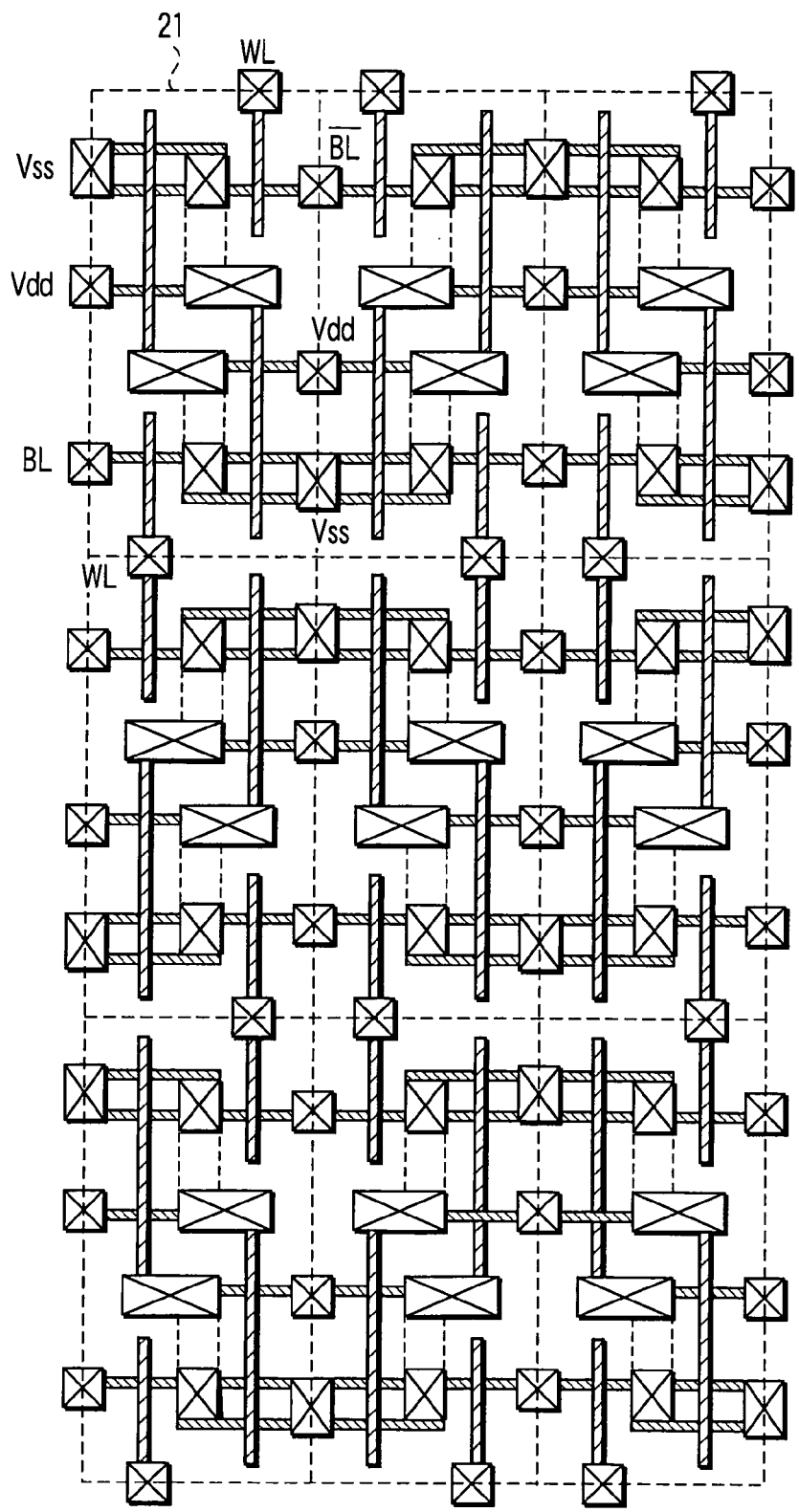
FIG. 7 is a layout diagram illustrating a cell array obtained by integrating the SRAM cells of the second embodiment.

FIG. 7 is a layout diagram illustrating a structure of a cell array obtained by integrating the SRAM cells. The cell array of the SRAM is formed by a plurality of the SRAM cells, one of which is shown in FIG. 6, arranged in rows and columns as shown in FIG. 7.

According to the embodiments of the present invention, it is possible to provide a semiconductor memory formed of FinFETs and having a good data-holding property.

Further, the above embodiments can not only be carried out singly, but also in combination. Further, each of the embodiments includes inventions of various phases, and it is possible to extract inventions of various phases by combining a plurality of constituent elements disclosed in the embodiments according to circumstances.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a first and a second field effect transistors having a first line as gates, one ends of current paths of the first and second field effect transistors being connected to a reference electrode supplied with a reference potential;
   a third and a fourth field effect transistors having a second line as gates, one ends of current paths of the third and fourth field effect transistors being connected to the reference electrode;

a fifth field effect transistor having a first word line as a gate, one end of a current path of the fifth field effect transistor being connected to the other ends of the current paths of the first and second field effect transistors; and a sixth field effect transistor having a second word line as a gate, one end of a current path of the sixth field effect transistor being connected to the other ends of the current paths of the third and fourth field effect transistors, wherein the current paths of the first and second field effect transistors are connected in parallel between the one end of the current path of the fifth field effect transistor and the reference electrode, and the current paths of the third and fourth field effect transistors are connected in parallel between the one end of the current path of the sixth field effect transistor and the reference electrode.

2. A semiconductor memory according to claim 1, wherein each of the first, second, third, fourth, fifth and sixth transistors includes a fin typed field effect transistor.

3. A semiconductor memory according to claim 1, wherein each of the first, second, third and fourth transistors forms a drive transistor, and each of the fifth and sixth transistors forms a transfer gate transistor.

4. A semiconductor memory according to claim 1, further comprising: a seventh field effect transistor having the first line as a gate; and an eighth field effect transistor having the second line as a gate.

5. A semiconductor memory according to claim 4, wherein one ends of current paths of the seventh and eighth field effect transistors are connected to a power supply electrode supplied with a power supply voltage.

6. A semiconductor memory according to claim 4, wherein the other ends of the current paths of the first and second field effect transistors are connected to the other end of the current path of the seventh field effect transistor, and the other ends of the current paths of the third and fourth field effect transistors are connected to the other end of the current path of the eighth field effect transistor.

7. A semiconductor memory according to claim 4, wherein the gates of the first, second and seventh field effect transistors are connected to the other ends of the current paths of the third and fourth field effect transistors, and the gates of the third, fourth and eighth field effect transistors are connected to the other end of the current path of the seventh field effect transistor.

8. A semiconductor memory according to claim 4, wherein the first, second, fifth and seventh field effect transistors are symmetrical to the third, fourth, sixth and eighth field effect transistors, respectively, with respect to a certain point.

9. A semiconductor memory comprising:

a first and a second field effect transistors having a first line as gates, one ends of current paths of the first and second field effect transistors being connected to a first reference electrode supplied with a reference potential;

a third and a fourth field effect transistors having a second line as gates, one ends of current paths of the third and fourth field effect transistors being connected to a second reference electrode supplied with the reference electrode;

a fifth field effect transistor having a first word line as a gate, one end of a current path of the fifth field effect transistor being connected to the other ends of the current paths of the first and second field effect transistors; and a sixth field effect transistor having a second word line as a gate, one end of a current path of the sixth field effect transistor being connected to the other ends of the current paths of the third and fourth field effect transistors, wherein the first, second and fifth field effect transistors are arranged symmetrically to the third, fourth and sixth field effect transistors, respectively, with respect to a central point between the fifth field effect transistor and the sixth field effect transistor, the current paths of the first and second field effect transistors are connected in parallel between the one end of the current path of the fifth field effect transistor and the first reference electrode, and the current paths of the third and fourth field effect transistors are connected in parallel between the one end of the current path of the sixth field effect transistor and the second reference electrode.

10. A semiconductor memory according to claim 9, wherein each of the first, second, third, fourth, fifth and sixth transistors includes a fin typed field effect transistor.

11. A semiconductor memory according to claim 9, wherein each of the first, second, third and fourth transistors forms a drive transistor, and each of the fifth and sixth transistors forms a transfer gate transistor.

12. A semiconductor memory according to claim 9, further comprising: a seventh field effect transistor having the first line as a gate; and an eighth field effect transistor having the second line as a gate.

13. A semiconductor memory according to claim 12, wherein one ends of current paths of the seventh and eighth field effect transistors are connected to a power supply electrode supplied with a power supply voltage.

14. A semiconductor memory according to claim 12, wherein the other ends of the current paths of the first and second field effect transistors are connected to the other end of the current path of the seventh field effect transistor, and the other ends of the current paths of the third and fourth field effect transistors are connected to the other end of the current path of the eighth field effect transistor.

15. A semiconductor memory according to claim 12, wherein the gates of the first, second and seventh field effect transistors are connected to the other ends of the current paths of the third and fourth field effect transistors, and the gates of the third, fourth and eighth field effect transistors are connected to the other end of the current path of the seventh field effect transistor.

16. A semiconductor memory comprising:

a group of drive transistors including a plurality of field effect transistors, each of which having a current path having one end connected to a reference electrode supplied with a reference potential; and a group of transfer gate transistors including a plurality of field effect transistors, each of which having a word line as a gate and having a current path with one end connected to the other ends of the current paths of the field effect transistors included in the drive transistor group, the number of the field effect transistors of the transfer gate transistor group being smaller than the number of the field effect transistors included in the drive transistor group, wherein the current paths of the field effect transistors included in the drive transistor group are connected in parallel between the one end of the current path of one of the field effect transistors included in the transfer gate transistor group and the reference electrode.

* * * * *